United States Patent
Sakai et al.

(10) Patent No.: US 9,015,932 B2
(45) Date of Patent: Apr. 28, 2015

(54) CONNECTING METHOD OF ELECTRONIC COMPONENT

(75) Inventors: Tadahiko Sakai, Fukuoka (JP); Hideki Eifuku, Fukuoka (JP)

(73) Assignee: Panasonic Corporation, Osaka (JP)

(*) Notice: Subject to any disclaimer, the term of this patent is extended or adjusted under 35 U.S.C. 154(b) by 1385 days.

(21) Appl. No.: 12/518,387

(22) PCT Filed: Dec. 26, 2007

(86) PCT No.: PCT/JP2007/075369
§ 371 (c)(1),
(2), (4) Date: Jun. 9, 2009

(87) PCT Pub. No.: WO2008/081969
PCT Pub. Date: Jul. 10, 2008

(65) Prior Publication Data
US 2010/0018048 A1 Jan. 28, 2010

(30) Foreign Application Priority Data
Dec. 28, 2006 (JP) .................... P2006-354301

(51) Int. Cl.
*H05K 3/30* (2006.01)
*H01R 12/62* (2011.01)
(Continued)

(52) U.S. Cl.
CPC ............ *H01R 12/62* (2013.01); *Y10T 29/4913* (2013.01); *H01R 12/592* (2013.01); *H05K 3/323* (2013.01);
(Continued)

(58) Field of Classification Search
CPC ...... H01R 12/62; H01R 12/592; H05K 3/361; H05K 3/323; H05K 2203/111; H05K 2203/0195; H05K 2203/0278; Y10T 29/4913; Y10T 29/49144
USPC ................. 29/830, 832, 840; 156/273.5, 372, 156/373.5; 174/259, 260; 349/150, 152; 438/119, 612; 348/119, 612; 439/150, 439/152
See application file for complete search history.

(56) References Cited

U.S. PATENT DOCUMENTS 5,311,341 A * 5/1994 Hirai ............................ 349/150
5,994,165 A 11/1999 Yoshino et al.
(Continued)

FOREIGN PATENT DOCUMENTS

JP 60-045028 A 3/1985
JP 10-022344 A 1/1998
(Continued)

OTHER PUBLICATIONS

Japanese Office Action dated Sep. 14, 2010.
(Continued)

*Primary Examiner* — Donghai D Nguyen
(74) *Attorney, Agent, or Firm* — Pearne & Gordon LLP

(57) ABSTRACT

It is to provide an electronic component connecting method capable of performing dehumidification within a short time without giving a thermal influence to an electronic component which has already been mounted on a wiring board. When a first connection terminal group 5 formed on a connection area 3 of a rigid board 1 is connected to a flexible board 2 where a second connection terminal group 6 has been formed by employing a thermosetting resin in an electrically conductive manner, since a connection area 3 which is heated in a step for thermally hardening the thermosetting resin is locally preheated, moisture, and oils and fats contained in the connection area 3 among such moisture, and oils and fats, which have been absorbed in the rigid board 1 are dehumidified. Thereafter, the thermosetting resin interposed between the first connection terminal group 5 and the second connection terminal group 6 is thermally hardened. Since the connection area 3 is locally preheated, the dehumidification can be carried out within a short time without giving a thermal influence to an electronic component 4 which has already been mounted on the rigid board 1.

5 Claims, 3 Drawing Sheets

(51) Int. Cl.
*H01R 12/59* (2011.01)
*H05K 3/36* (2006.01)
*H05K 3/32* (2006.01)

(52) U.S. Cl.
CPC ........ *H05K 3/361* (2013.01); *H05K 2203/0195* (2013.01); *H05K 2203/0278* (2013.01); *H05K 2203/111* (2013.01)

(56) References Cited

U.S. PATENT DOCUMENTS

| | | | |
|---|---|---|---|
| 6,077,382 A | 6/2000 | Watanabe | |
| 6,462,284 B1 * | 10/2002 | Hashimoto | ................. 29/832 |
| 6,864,119 B2 | 3/2005 | Seko | |
| 7,341,642 B2 | 3/2008 | Kumakura | |
| 2004/0063332 A1 | 4/2004 | Seko | |
| 2004/0079464 A1 | 4/2004 | Kumakura | |
| 2005/0176310 A1 | 8/2005 | Kataoka et al. | |

FOREIGN PATENT DOCUMENTS

| | | |
|---|---|---|
| JP | 10-223686 A | 8/1998 |
| JP | 11-087429 A | 3/1999 |
| JP | 2002-252254 A | 9/2002 |
| JP | 2004-128337 A | 4/2004 |
| JP | 2005-203104 A | 7/2005 |
| WO | 2006/123554 A1 | 11/2006 |

OTHER PUBLICATIONS

International Search Report for PCT/JP2007/075369.

* cited by examiner

CONNECTING METHOD OF ELECTRONIC COMPONENT

TECHNICAL FIELD

The present invention is related to an electronic component connecting method for connecting a flexible board, and an electronic component such as a flip chip equipped with a connection-purpose terminal with respect to a wiring board in an electrically conductive manner.

BACKGROUND ART

As connecting materials in such a case that flexible boards and electronic components (flip chips etc.) equipped with connection-purpose terminals are connected to wiring boards in electrically conductive manners, thermosetting resins have been widely employed. A thermosetting resin has a property that when the thermosetting resin is heated, polymerization occurs, a mesh structure of macromolecular is formed, and then, the thermosetting resin is hardened. As a consequence, under such a condition that a thermosetting resin is interposed between an electronic component and a wiring board (generally speaking, under such a condition that electronic component is mounted on wiring board where thermosetting resin has been previously coated), heat is applied from the side of the electronic component, or from the side of the wiring board, so that the thermosetting resin is hardened, and thus, the electronic component is connected to the wiring board.

As to wiring boards, there are many cases that a large number of wiring boards have been manufactured by forming resins. As a result, these resin wiring boards may absorb moisture when the resin wiring boards are stored, or are transported after the productions thereof. As previously explained, when the thermosetting resins are heated the wiring boards are also heated. As a result, there are some possibilities that the absorbed components are vaporized to be left as voids within the hardened resins. Since the voids left in the hardened resins may cause a factor for deteriorating connection reliability, conventionally, dehumidification has been carried out by which the wiring boards themselves before electronic components are mounted are heated so as to vaporize the absorbed components (refer to patent publication 1)

[Patent Publication 1] JP-A-10-223686

DISCLOSURE OF INVENTION

As to electronic components which are mounted on wiring boards, as previously explained, there are the flexible boards which are mounted by employing the thermosetting resins, and the electronic components such as flip chips, e.g, chips equipped with bumps. In addition these electronic components, there are many other sorts and modes of electronic components, for instance, relatively small-sized components such as semiconductor chips and resistors, which are mounted by soldering manners with employment of a reflow apparatus; and also, relatively large-sized semi-products such as camera units, sensors, and connectors. Thus, timing for mounting these electronic components on the wiring boards is different from each other. Normally, mounting of electronic components on wiring boards by using thermosetting resins is carried out after other electronic components have been mounted on the wiring boards. There are some possibilities that the conventional method for heating the wiring boards themselves cannot be applied, since there is a problem as to the heat resistant characteristics, depending upon sorts of such electronic components which have already been mounted on the wiring boards. Also, even in such a case that electronic components are mounted on wring boards by employing thermosetting resins at the stage that other electronic components have not yet been mounted, the entire areas of the wiring boards are heated in the conventional heating process operation. As a result, such a time defined from 30 minutes up to approximately 1 hour is required. Therefore, there is such a problem that productivity is lowered, and electronic components are deteriorated due to thermal histories.

As a consequence, the present invention has an object to provide an electronic component connecting method capable of performing dehumidification without giving a thermal influence to an electronic component which has already been mounted on a wiring board. Another object of the present invention is to provide an electronic component connecting method capable of performing the dehumidification within a short time.

According to the invention, an electronic component connecting method for connecting a first connection terminal group formed on a connection area of a wiring board to an electronic component on which a second connection terminal group corresponding to the first connection terminal group has been formed in an electrically conductive manner, the method comprises: a step for locally preheating the connection area; a step for interposing a thermosetting connection material between the first connection terminal group and a second connection terminal; and a step for crimping both the first connection terminal group and the second connection terminal group, and for thermally hardening the thermosetting connection material.

Additionally, the connection area is depressed by a heating tool so as to preheat the connection area.

Additionally, the second connection terminal group is depressed with respect to the first connection terminal by employing the heating tool, and the thermosetting connection material is heated by employing the heating tool.

Additionally, the connection area is preheated while a heating tool is not contacted to the connection area.

In accordance with the present invention, the connection area for connecting the wiring board to the electronic components is locally preheated. As a result, the dehumidification can be carried out within a short time without giving the thermal influence to such electronic components which have already been mounted on the wiring board.

BEST MODE FOR CARRYING OUT THE INVENTION

Figure 1:
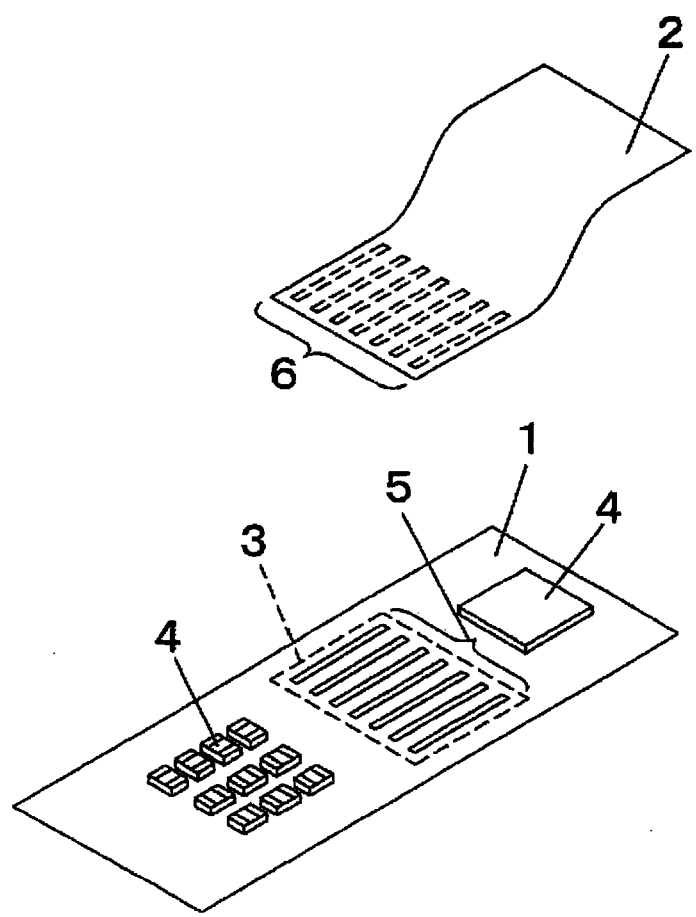
FIG. 1 is a perspective view for indicating a rigid board and a flexible board according to an embodiment mode of the present invention.

Referring now to drawings, a description is made of embodiment modes of the present invention. In FIG. 1, a rigid board 1 is a wiring board on which a circuit has been printed, and large numbers and large sorts of electronic components 4 have been mounted on an area except for a connection area 3 formed in a portion of this wiring board. A first connection terminal array 5 has been formed in the connection area 3, while the first connection terminal array 5 corresponds to a connection-purpose electrode to be connected with a flexible board 2 for a connecting subject. On the other hand, a second connection terminal array 6 which corresponds to the first connection terminal array 5 has been formed on an edge portion of the flexible board 2.

Figure 2:
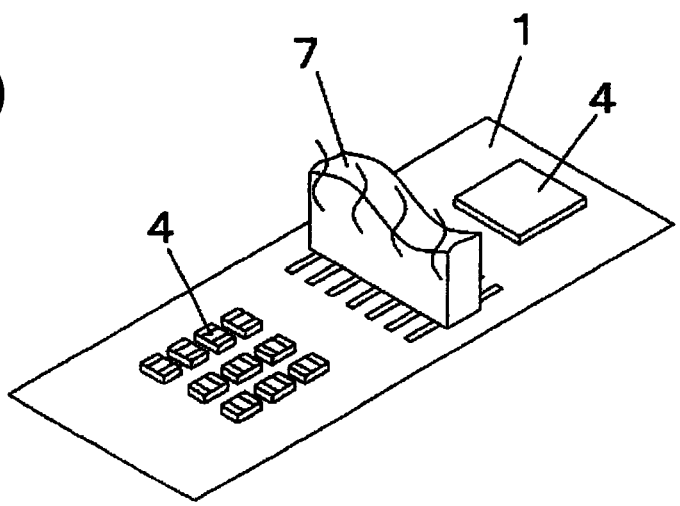
FIGS. 2(a) and 2(b) are perspective views for explaining a method of connecting the rigid board to the flexible board, according to the embodiment mode of the present invention.
Figure 2:
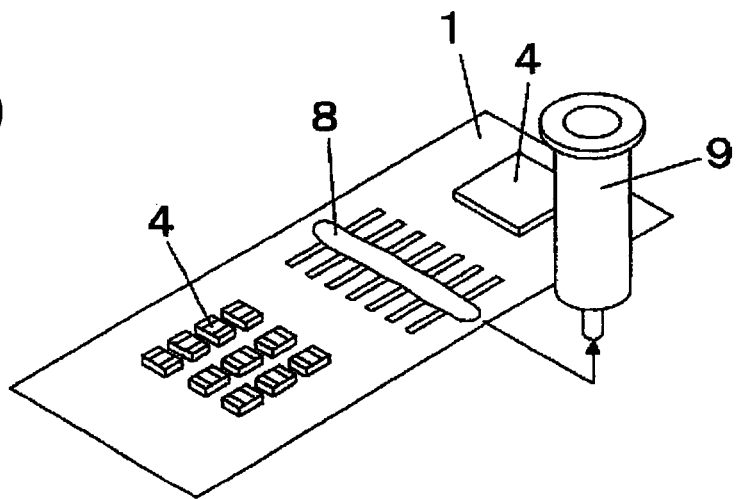

In the case that the flexible board 2 is connected to the rigid board 1, first of all, only the connection area 3 is locally preheated so as to remove moisture (dehumidify), and oils and fats, which have been absorbed in the rigid board 1. In FIG. 2(*a*), while a heating tool 7 utilizing an electric heating effect is heated up to a temperature of approximately 200 degrees, the heating tool 7 is depressed against the connection area 3 for approximately 5 seconds in order to perform a heating process operation with respect to the connection area 3. Since this heating process operation is performed, such moisture, oils and fats, and the like contained in the connection area 3 are removed among the moisture, and the oils and fats, which have been absorbed in the rigid board 1.

When heating process operations are carried out, in addition to contact type heating means such as the heating tool 7 which are directly contacted to the connection area 3 so as to perform heating process operations, non-contact type hating means which are not directly contacted to the connection area 3 may be employed. That is, a soft beam irradiating apparatus, a laser irradiating apparatus, a hot air jetting apparatus, and the like may be alternatively employed as the above-described non-contact type heating means in order to feed soft beams, laser, heating gas, and so on. Even when any one of these contact type heating means and non-contact type heating means is employed, since the heating process operation can be locally carried out, the connection area 3 to be connected with the flexible board 2 can be dehumidified without giving a thermal influence to the electronic components which have already been mounted on the rigid board 1.

Only the connection area 3 which will be formally heated in a succeeding thermal crimping step may have such a risk about an occurrence of remaining voids which are caused when absorbed humidity components are vaporized. As a consequence, only the connection area 3, not the entire area of the rigid board 1, is locally dehumidified, so that the occurrence of the remaining voids can be suppressed. As previously described, since such an area which is preheated in order to perform dehumidification is restricted only to a minimum area, namely, the connection area 3, a time required for the dehumidification can be largely reduced, as compared with a time required for such a dehumidification that the entire area of the rigid board 1 is dehumidified.

Next, a thermosetting connection material is supplied to the connection area 3. In FIG. 2(*b*), a thermosetting resin which is supplied to the connection area 3 corresponds to anisotropic conductive paste (ACP) 8 made by dispersing conductive particles to a paste-shaped thermosetting resin. While a dispenser 9 which has stored thereinto the ACP 8 is transported above the connection area 3, this dispenser 9 coats the ACP 8 on the connection region 3. Since the dispenser 9 can be approached from the upper space to the connection area 3, even in such a case that the electronic component 4 have been mounted in a tightly closed condition around the connection area 3, the dispenser 9 can coat the ACP 8. Alternatively, as the thermosetting connection material, an anistropic conductive film (ACF) may be used and may be supplied to the connection area 3 by employing an exclusively-used apparatus. Both an ACP and an ACF correspond to such anisotropic conductive materials which simultaneously have a plurality of functions such as an adhering function, an electrically conducting function, and an insulating function. Since a thermal crimping treatment is performed with respect to these ACP and ACF, these anisotropic conductive materials represent conductive characteristics with respect to a thickness direction on a crimp plane, and on the other hand, represents an insulating material with respect to a direction of this crimp plane.

It should be understood that since the first connection terminal array 5 and the second connection terminal array 6 are not directly metal-joined to each other, the first connection terminal array 5 is connected to the second connection terminal array 6 via the electric conductive particles contained in the anisotropic conductive material. In such a case that a first connection terminal group corresponds to lands formed on the rigid board 1 and a second connection terminal group corresponds to metal bumps formed on a flip chip, or the like, since the melted bumps are metal-joined to the melted lands, the conductive particles may no longer intervene between these melted lands and bumps. In this alternative case, these melted lands and bumps may be connected to each other by not employing the anisotropic conductive material, but by employing a thermosetting resin, and the like, which do not contain conductive particles.

Figure 3:
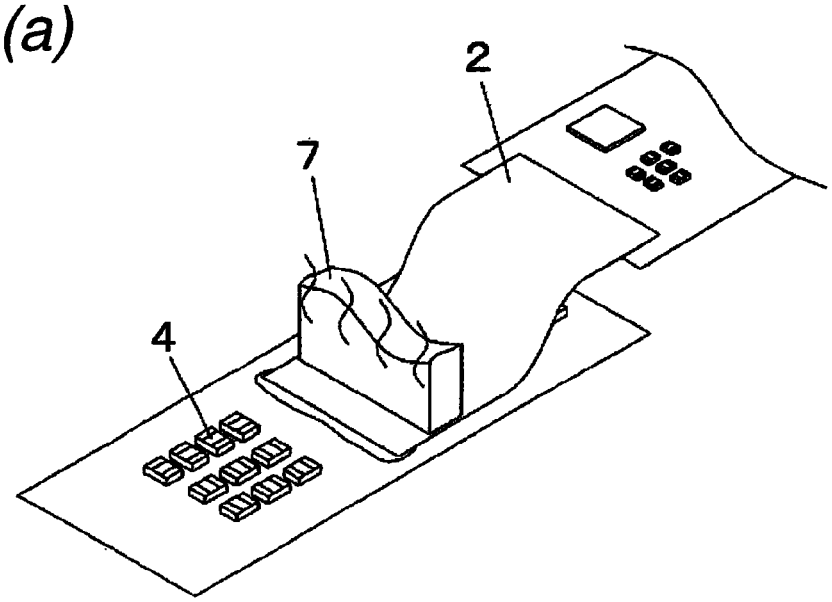
FIGS. 3(a) and 3(b) are perspective views for explaining a method of connecting the rigid board to the flexible board, according to the embodiment mode of the present invention.
Figure 3:
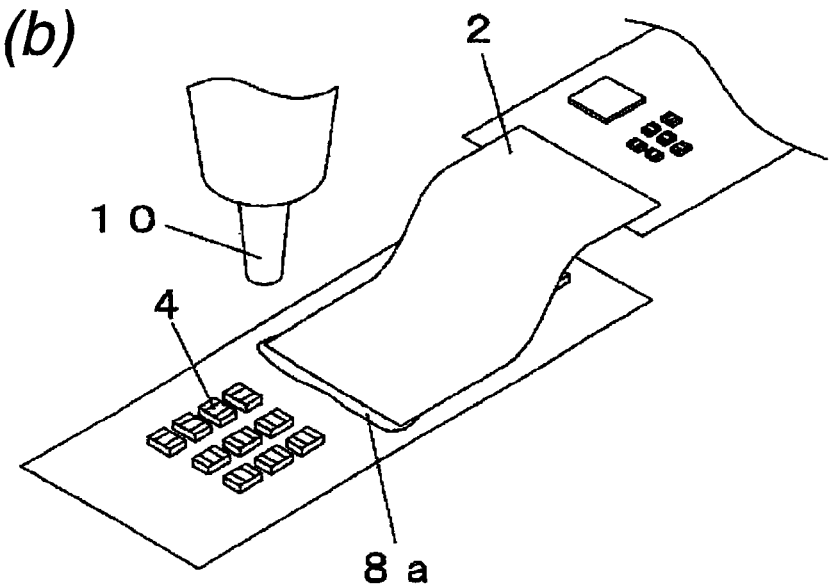

Next, under such a condition that a thermosetting connection material is interposed between the first connection terminal group and the second connection terminal group, both the first connection terminal group and the second connection terminal group are crimped, and also, the thermosetting connection material is thermally hardened. In FIG. 3(*a*), the edge portion of the flexible board 2 which has been overlapped with the ACP 8 coated on the connection region 3 is depressed on the side of the rigid board 1 by the heating tool 7. As a result, the ACP 8 depressed between the edge portion of the flexible board 2 and the rigid board 1 is pushed to be widened along the crimp plane direction, and the conductive particles sandwiched between the first connection terminal array 5 and the second connection terminal array 6, which are located opposite thereto, are crimped to both the connection terminal arrays 5 and 6. Thereafter, the thermosetting resin functioning as a binder of the ACP 8 is thermally hardened, so that the edge portion of the flexible board 2 is connected to the connection area 3 of the rigid board 1, and the conductive particles sandwiched between both the first and second connection terminal arrays 5 and 6 are maintained under such a condition that these conductive particles are crimped to the first and second connection terminal arrays 5 and 6. Since the above-described thermal crimping step is performed under a high temperature environment of approximately 180 degrees, there are some possibilities that moisture, and oils and flats, which have been absorbed in the rigid board 1, are vaporized and are left as voids within the hardened resin. However, the connection area 3 which is heated during the thermal crimping operation has been previously preheated in the preheating step so as to perform the dehumidification. As a result, there is no possibility that the above-described remaining void never occurs.

Although a single heating tool may be commonly used in the preheating step and the thermal crimping step, if separate heating tools are used in the preheating step and the thermal crimping step, then both the preheating step and the thermal crimping step may be alternatively carried out in a parallel manner, so that an improvement in a manufacturing efficiency may be realized. Alternatively, a non-contact type heating means may be employed in the preheating step. As the non-contact type heating means, a soft beam irradiating apparatus, a laser irradiating apparatus, a hot air jetting apparatus, and the like may be utilized. As represented in FIG. 3(*b*), these non-contact type heating means may also be used as such a means 10 for heating a resin fillet 8a (after cure) in the thermal crimping step. That is, the resin fillet 8a is pushed to be widened along the crimp plane direction in the thermal crimping step, while heat generated from a heating tool can be hardly transferred to the resin fillet 8a. As a result, the above-described heating means can eliminate the conventional heating apparatus in which the entire board is heated so as to perform the after cure. Also, since the after cure is locally performed in the embodiment mode, it is possible to avoid that the electronic components 4 are deteriorated due to the after cure.

INDUSTRIAL APPLICABILITY

In accordance with the present invention, while the electronic component connecting method has the following merit, this electronic component connecting method is especially advantageous as a method for connecting a wiring board built in a mobile type mobile appliance which requires a high density mounting technique: That is, as to the merit, the connection area for connecting the wiring board to the electronic components, is locally preheated. As a result, the dehumidification can be carried out within a short time, while giving no thermal influence to such electronic components which have already been mounted on the wiring board.

This application is based upon and claims the benefit of priority of Japanese Patent Application No. 2006-354301 filed on Dec. 28, 2006, the contents of which are incorporated herein by reference in its entirety.

The invention claimed is:

1. An electronic component connecting method for connecting a first connection terminal group formed on a connection area of a wiring board to an electronic component on which a second connection terminal group corresponding to said first connection terminal group has been formed in an electrically conductive manner, the connecting method comprising the steps of:
   locally preheating said connection area on which thermosetting connection material is formed in a following step;
   after the preheating, interposing a thermosetting connection material between said first connection terminal group and a second connection terminal;
   crimping both said first connection terminal group and said second connection terminal group;
   thermally hardening said thermosetting connection material,
   wherein said connection area is depressed by a heating tool so as to preheat the connection area.

2. An electronic component connecting method as claimed in claim 1, wherein said second connection terminal group is depressed with respect to said first connection terminal by employing said heating tool, and said thermosetting connection material is heated by employing the heating tool.

3. An electronic component connecting method as claimed in claim 1, wherein said connection area is depressed by directly contacting said heating tool to said connection area so as to preheat the connection area.

4. An electronic component connecting method as claimed in claim 1, wherein said heating tool is pushed against and directly contacted to said connection area so as to preheat the connection area.

5. An electronic component connecting method as claimed in claim 1, wherein an area to be preheated by said heating tool is restricted to said connection area.

* * * * *